United States Patent
Manousakis et al.

(10) Patent No.: US 11,357,130 B2
(45) Date of Patent: Jun. 7, 2022

(54) SCALABLE THERMAL RIDE-THROUGH FOR IMMERSION-COOLED SERVER SYSTEMS

(71) Applicant: Microsoft Technology Licensing, LLC, Redmond, WA (US)

(72) Inventors: Ioannis Manousakis, Redmond, WA (US); Nicholas Andrew Keehn, Kirkland, WA (US); Husam Atallah Alissa, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/915,295

(22) Filed: Jun. 29, 2020

(65) Prior Publication Data

US 2021/0410319 A1   Dec. 30, 2021

(51) Int. Cl.
*H05K 7/20* (2006.01)
*H01L 23/427* (2006.01)
*H01L 23/473* (2006.01)
*G06F 1/20* (2006.01)

(52) U.S. Cl.
CPC .............. *H05K 7/203* (2013.01); *G06F 1/20* (2013.01); *H05K 7/20309* (2013.01); *H05K 7/20327* (2013.01); *H05K 7/20809* (2013.01); *H01L 23/427* (2013.01); *H01L 23/4275* (2013.01); *H01L 23/473* (2013.01); *H05K 7/20318* (2013.01)

(58) Field of Classification Search
CPC .............. H05K 7/203; H05K 7/20309; H05K 7/20318; H05K 7/20327; G06F 1/20
See application file for complete search history.

(56) References Cited

U.S. PATENT DOCUMENTS

| | | | | |
|---|---|---|---|---|
| 2,968,932 A | * | 1/1961 | Vance | F25D 5/02 62/4 |
| 4,029,999 A | * | 6/1977 | Neumann | H05K 3/284 361/704 |
| 4,528,218 A | * | 7/1985 | Maione | B65D 81/3484 62/86 |

(Continued)

FOREIGN PATENT DOCUMENTS

DE   102013102725 A1 *  9/2014   ............. C08L 63/00
EP       0298372 A2      1/1989

OTHER PUBLICATIONS

Chu, et al., "Thermal Card and Deflector System for Augmenting Emersion Cooling", In IBM Technical Disclosure Bulletin, vol. 10, Issue 10, Mar. 1, 1968, pp. 1559-1560.

(Continued)

*Primary Examiner* — Robert J Hoffberg
(74) *Attorney, Agent, or Firm* — Ray Quinney & Nebeker P.C.; Paul N. Taylor

(57) ABSTRACT

A thermal management system for a computing device includes an immersion tank with a cooling fluid therein, a computing device positioned in the cooling fluid in the immersion tank, and a thermal block positioned in the cooling fluid in the immersion tank. The computing device heats the cooling fluid, and the thermal block is configured to receive heat from the cooling fluid. The thermal block includes a fluid management feature to direct flow of the cooling fluid relative to the thermal block and computing device.

17 Claims, 5 Drawing Sheets

(56) References Cited

U.S. PATENT DOCUMENTS

| | | | | |
|---|---|---|---|---|
| 4,615,463 A * | 10/1986 | Price | ...................... | F25D 5/02 220/592.17 |
| 4,637,990 A * | 1/1987 | Torobin | .............. | C04B 41/4584 502/10 |
| 4,694,378 A | 9/1987 | Nakayama et al. | | |
| 4,793,980 A * | 12/1988 | Torobin | .................. | B01J 35/08 423/213.5 |
| 4,949,164 A * | 8/1990 | Ohashi | .................. | H01L 23/427 165/104.33 |
| 5,208,733 A * | 5/1993 | Besanger | ............... | H05K 3/284 361/704 |
| 6,640,801 B2 * | 11/2003 | Sabin | ..................... | A61F 7/034 126/263.01 |
| 8,226,874 B2 * | 7/2012 | Huffstutler | ............ | H05K 3/284 264/272.17 |
| 8,310,831 B2 * | 11/2012 | Pal | .................... | H05K 7/20445 361/700 |
| 9,560,789 B2 * | 1/2017 | Smith | ................ | H05K 7/20327 |
| 10,398,063 B2 * | 8/2019 | Smith | .................. | H01L 23/427 |
| 10,674,641 B2 * | 6/2020 | Shepard | ................. | H05K 7/203 |
| 2003/0157342 A1 * | 8/2003 | Myers | ................. | H01L 23/4275 428/447 |
| 2004/0194472 A1 * | 10/2004 | Wohland | ............ | B65D 81/3266 62/4 |
| 2013/0174581 A1 * | 7/2013 | Rasmussen | ............... | F25D 5/02 62/4 |
| 2015/0022975 A1 * | 1/2015 | Browne | ............. | H01L 23/4012 361/700 |
| 2015/0144295 A1 | 5/2015 | Miura et al. | | |
| 2016/0270252 A1 * | 9/2016 | Miura | .................. | H05K 7/2029 |
| 2020/0236808 A1 * | 7/2020 | Smith | .................... | H05K 7/203 |

OTHER PUBLICATIONS

"Invitation to Pay Additional Fees Issued in PCT Application No. PCT/US21/028036", dated Jul. 28, 2021, 6 Pages.

"International Search Report and Written Opinion issued in PCT Application No. PCT/US21/028036", dated Sep. 24, 2021, 17 Pages.

* cited by examiner

SCALABLE THERMAL RIDE-THROUGH FOR IMMERSION-COOLED SERVER SYSTEMS

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Liquid cooling can effectively cool components as liquid cooling fluids have more thermal mass than air or gas cooling. The liquid cooling fluid can be maintained at a lower temperature by allowing vaporized fluid to rise out of the liquid. The vapor in the cooling liquid can adversely affect the cooling performance of the cooling fluid. The vapor can be condensed and returned to the immersion tank.

In conventional immersion cooling systems, a large percentage of the immersion tank contains cooling fluid that functioning as a heat sink and is not efficiently removing heat from the system through boiling. High costs are associated with obtaining, containing, and maintaining the additional cooling fluid despite the relatively low efficiency of its inclusion in the immersion tank.

BRIEF SUMMARY

In some embodiments, a thermal management system for a computing device includes an immersion tank with a cooling fluid therein, a computing device positioned in the cooling fluid in the immersion tank, and a thermal block positioned in the cooling fluid in the immersion tank. The computing device heats the cooling fluid, and the thermal block is configured to receive heat from the cooling fluid. The thermal block includes a fluid management feature to direct flow of the cooling fluid relative to the thermal block and computing device.

In some embodiments, a thermal management system for a computing device includes an immersion tank with a cooling fluid therein, a computing device positioned in the cooling fluid in the immersion tank, and a thermal block positioned in the cooling fluid in the immersion tank. The computing device heats the cooling fluid, and the thermal block is configured to receive heat from the cooling fluid. The thermal block is a container with a second material therein.

In some embodiments, a thermal management system for a computing device includes an immersion tank with a cooling fluid therein, a computing device positioned in the cooling fluid in the immersion tank, and a thermal block positioned in the cooling fluid in the immersion tank. The computing device heats the cooling fluid, and the thermal block is configured to receive heat from the cooling fluid. The thermal block is a container with a second material and a third material therein, which are endothermic ally reactive with one another.

This Summary is provided to introduce a selection of concepts in a simplified form that are further described below in the Detailed Description. This Summary is not intended to identify key features or essential features of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 7-1 is a schematic side view of a thermal block with a failsafe mechanism prior to use, according to at least some embodiments of the present disclosure;

FIG. 7-2 is a schematic side view of the thermal block of FIG. 7-1 with the failsafe mechanism in use, according to at least some embodiments of the present disclosure;

DETAILED DESCRIPTION

Figure 1:
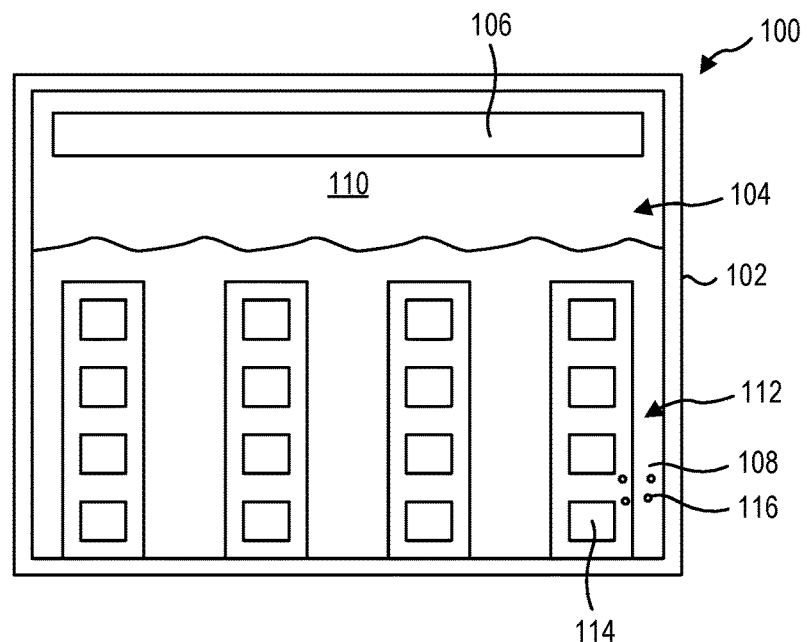
FIG. 1 is a schematic representation of an immersion cooling system.

The present disclosure relates generally to systems and methods for improving cooling capacity and efficiency of immersion cooling systems. More particularly, the present disclosure relates to increasing the heat capacity of the immersion cooling system and improving the efficiency of fluid movement within the system. In some embodiments, immersion cooling systems cool computing devices or systems that include heat-generating components. The heat-generating components are immersed in a cooling fluid that absorbs the heat from the heat-generating components to cool the heat-generating components. In a two-phase immersion cooling system, the cooling fluid can vaporize. The latent heat of vaporization, combined with the efficient removal of the hot vapor due to the buoyancy in the liquid cooling fluid, allows for very efficient removal of heat from the computing device. The vapor is then passed through a condenser, which cools the vapor cooling fluid to condense and return the cooling fluid to the immersion chamber in a liquid phase.

Temporary operating load increases of the heat-generating components can cause temperature spikes in the surrounding cooling fluid. Further, a power failure can cause the cooling fluid to begin vaporizing quickly, increasing the pressure and temperature in the system and risking damage to the computing devices in the immersion cooling system. Immersion cooling systems include backup power supplies, such as generators, to support the condensers and other cooling systems, but additional thermal ride-through capacity of the immersion cooling system can bridge the time gap before those systems can respond to a power failure. Additionally, increased thermal ride-through capacity can allow temporary overclocking or overvoltaging of a heat-generating component without overwhelming the immersion cooling system's ability to condense the vaporized cooling fluid.

In some immersion cooling systems according to the present disclosure, a thermal block is positioned in the immersion cooling system to replace a portion of the cooling fluid with a thermal mass that has a higher specific heat than the cooling fluid to buffer temperature changes in the cooling fluid. In some embodiments, the thermal block has one or more fluid management features to direct and/or control the flow of cooling fluid over or through the thermal block. The fluid management features may direct liquid cooling fluid toward one or more heat-generating components of a computing device. The fluid management features may direct vapor cooling fluid away from one or more heat-generating components of a computing device.

In some embodiments, the fluid management features include channels formed in a surface of the thermal block. For example, fluid management channels may direct vapor bubbles formed by the a heat-generating component away from the heat-generating component while also encouraging the displacement of the vapor bubbles to draw liquid cooling fluid toward the heat-generating component from a cooler region of thermal block or the computing device. In some embodiments, fluid management channels capture and direct vapor bubbles toward a condenser or vapor conduit to a condenser to more efficiency collect and condense the vaporized cooling fluid.

An immersion cooling system, in some embodiments, has a fluid management feature including a fluid port through at least a portion of the thermal block to direct a flow of cooling fluid at a heat-generating component. For example, a fluid conduit (e.g., a hose) may connect an inlet port of the thermal block to a liquid return port from a condenser of the immersion cooling system. In some embodiments, the fluid management feature of the thermal block connects the inlet port to an outlet port adjacent to and/or proximate to the heat-generating component to direct the recently condensed and cooled liquid cooling fluid at the heat-generating component.

In some embodiments, a thermal block according to the present disclosure includes an emergency cooling failsafe. In some embodiments, the failsafe is a single-use consumable device while in other embodiments, the failsafe is resettable and/or reusable. An emergency cooling failsafe, according to the present disclosure, includes a mechanism for producing an endothermic reaction to absorb heat from the cooling fluid to cool the heat-generating components and limit or prevent dryout before the heat-generating components are damaged. For example, a thermal block may include two chemically reactive materials that, when exposed to one another, produce an endothermic reaction. The two chemically reactive materials may be separated from one another by a temperature-sensitive membrane. In some embodiments, when the membrane exceeds a breakdown temperature, the membrane degrades and allows the two chemically reactive materials to mix and/or react with one another.

Referring now to FIG. 1, an immersion cooling system 100 according to the present disclosure includes a chamber 102 with a cooling fluid 104 positioned therein. A condenser 106 is positioned at the top of the cooling fluid 104 above the liquid cooling fluid 108 and in a vapor 110 of the cooling fluid 104. The condenser 106 cools part of the vapor 110 of the cooling fluid 104 back into a liquid phase, removing thermal energy from the system and reintroducing the cooling fluid 104 into the immersion bath 112 of the liquid cooling fluid 108.

In some embodiments, the immersion bath 112 of the liquid cooling fluid 108 has a plurality of heat-generating components 114 positioned in the liquid cooling fluid 108. The liquid cooling fluid 108 surrounds the heat-generating components 114 and may surround other objects or parts attached to the heat-generating components 114.

As described, conversion of the liquid cooling fluid 108 to a vapor phase 116 requires the input of thermal energy to overcome the latent heat of vaporization and may be an effective mechanism to increase the thermal capacity of the cooling fluid and remove heat from the heat-generating components 114.

The cooling fluid transitions between a liquid phase and a vapor phase to remove heat from hot or heat-generating components in the chamber. The liquid phase more efficiently receives heat from the components and, upon transition to the vapor phase, the cooling fluid can be cooled and condensed to extract the heat from the cooling fluid before the cooling fluid is returned to the liquid immersion bath at a lower temperature.

In some embodiments, the immersion bath of the liquid cooling fluid 108 has a plurality of heat-generating components 114 positioned in the liquid cooling fluid 108. The liquid cooling fluid 108 surrounds the heat-generating components 114 and other objects or parts attached to the heat-generating components 114. In some embodiments, one or more of the heat-generating components 114 includes a heat sink or other device attached to the heat-generating component 114 to conduct away thermal energy and effectively increase the surface area of the heat-generating component 114.

Because the vapor phase 116 rises in the liquid cooling fluid 108, the vapor phase 116 can be extracted from the immersion chamber 102 in an upper vapor region 110 of the chamber 102. A condenser 106 cools part of the vapor of the cooling fluid 104 back into a liquid phase, removing thermal energy from the system and reintroducing the cooling fluid into the immersion bath 112 of the liquid cooling fluid 108. The condenser 106 radiates or otherwise dumps the thermal energy from the cooling fluid 104 into the ambient environment or into a conduit to carry the thermal energy away from the cooling system 100.

In some embodiments, the cooling fluid receives heat in a cooling volume of cooling fluid immediately surrounding the heat-generating components. The cooling volume is the region of the cooling fluid (including both liquid and vapor phases) that is immediately surrounding the heat-generating components and is responsible for the convective cooling of the heat-generating components. In some embodiments, the cooling volume is the volume of cooling fluid within 5 millimeters (mm) of the heat-generating components.

The cooling fluid has a boiling temperature below a critical temperature at which the heat-generating components experience thermal damage. For example, the heat-generating components may be computing components that experience damage above 100° Celsius (C). In some embodiments, the boiling temperature of the cooling fluid is less than a critical temperature of the heat-generating components. In some embodiments, the boiling temperature of the cooling fluid is less than about 90° C., less than about 80° C., less than about 70° C., or less than about 60° C. In some embodiments, the boiling temperature of the cooling fluid is at least about 35° C. In some embodiments, the cooling fluid includes water, glycol, or a combination of water and glycol. In some embodiments, the cooling fluid is an aqueous solution. In some embodiments, the cooling fluid is an electronic liquid, such as FC-72 available from 3M, or similar non-conductive fluids. The heat-generating components, immersion tank surfaces, or other elements of the immersion cooling system positioned in the cooling fluid may have nucleation sites on a surface thereof that promote the nucleation of vapor bubbles of the cooling fluid at or below the boiling temperature of the cooling fluid.

Large immersion cooling systems require a portion of the immersion bath volume to be cooling fluid that is outside of the cooling volume and, therefore, inefficiently cooling the heat-generating components. In some embodiments, not all components of the computing device generate enough heat to need immersion cooling to remain in a safe operating temperature range. In some embodiments, a graphical processing unit (GPU) generates more heat than a platen-based storage device, and ambient air cooling is sufficient to cool the storage device but not the GPU.

A thermal block according to the present disclosure, in some embodiments, has an inner surface that is oriented toward the computing device or other heat-generating component that is shaped to approximate the shape of the computing device. In some embodiments, the inner surface is shaped to complementarily mate with the topography of the computing device. For example, the inner surface of the thermal block may be formed to follow the surface of the heat-generating components of the computing device such that the inner surface is between 5 millimeters (mm) and 10 mm of at least two of the heat-generating components. In some embodiments, the inner surface of the thermal block may be formed to be positioned with 5 to 10 mm of the entire of surface of the computing device. The close placement of the thermal block to the heat-generating component allows efficient transfer of heat to the thermal block, however, some space therebetween is maintained to allow fluid flow and the evacuation of vapor bubbles.

In some embodiments, the thermal block has at least one channel positioned on the inner surface that is recessed away from the computing device. The thermal block may have a single channel that facilitates a higher rate of fluid transfer through the portion of the thermal block including the channel. The thermal block may include a plurality of channels to disperse vapor cooling fluid over a larger area of the computing device and/or remove vapor cooling fluid from the computing device to limit and/or prevent dryout. In some embodiments, the channel has a depth relative to the surface of the computing device that varies along a length of the channel. For example, the channel may have an increasing depth along the length of the channel to allow the removal of vapor, which occupies a larger volume than the liquid cooling fluid and which forms a greater percentage of the cooling fluid as the vapor bubbles float up along the length of the channel.

The thermal block has, in some embodiments, a vapor outlet formed in an end of the block that collects and directs vapor bubbles toward a vapor collection device. As the vapor bubbles flow upward through the channel and out of the vapor outlet, the vapor bubbles can create a risk of dryout for components positioned above the thermal block (e.g., in the direction of buoyancy in the cooling fluid). In some embodiments, the thermal block has a vapor outlet formed in an end of the block that directs vapor bubbles away from a second thermal block or second computing device in a flow direction of the bubbles.

Figure 2:
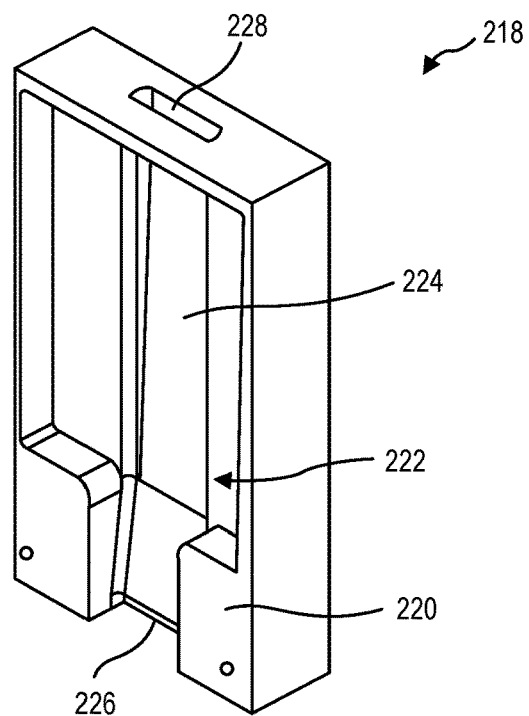
FIG. 2 is a perspective view of a thermal block for use in an immersion cooling system, according to at least some embodiments of the present disclosure.

FIG. 2 is a perspective view of an embodiment of a thermal block 218. The thermal block 218 has an inner surface 220 with a recess 222 therein to accommodate a heat-generating component. The recess 222 has a channel 224 further recessed from the inner surface 220. The channel 224 provides a flow path from a lower intake 226 of the thermal block 218 to a vapor outlet 228 at the top of the thermal block 218. The inner surface 220 of the recess 222 is positioned closer to a surface of a heat-generating component to receive heat therefrom, while the channel 224 facilitates fluid flow through the thermal block 218 to draw fluid across the heat-generating component.

Figure 3:
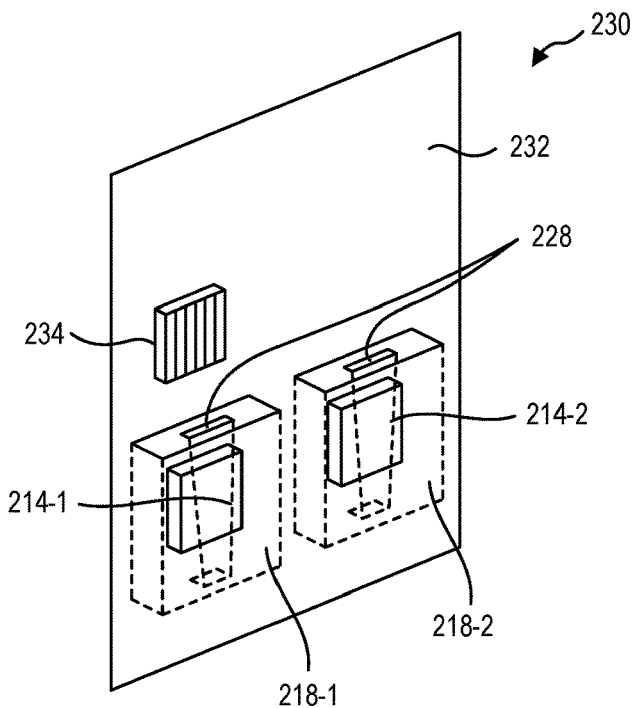
FIG. 3 is a perspective view of a computing device with a plurality of the thermal blocks of FIG. 2 for use in an immersion cooling system, according to at least some embodiments of the present disclosure.

FIG. 3 is a perspective view of embodiments of the thermal block 218 of FIG. 2 connected to a computing device 230. The computing device 230 has a plurality of heat-generating components thereon, and individual thermal blocks 218-1, 218-2 are positioned on the board 232 of the computing device 230 to receive heat from and direct cooling fluid across the heat-generating components 214-1, 214-2.

In some embodiments, the vapor outlet 228 of the thermal blocks 218-1, 218-2 is spaced apart from the board 232 such that vapor bubbles expelled from the thermal blocks 218-1, 218-2 are directed away from other components of the computing device, such as the heat sink 234 illustrated in FIG. 3 above the first thermal block 218-1.

In some embodiments, at least one of the thermal blocks 218-1, 218-2 includes a fiduciary mark 235 on an outer surface of the thermal blocks 218-1, 218-2 that is identifiable by a machine vision system to locate and/or orient the thermal blocks 218-1, 218-2 and/or the computing device 230 in a server rack or immersion cooling system.

Figure 4:
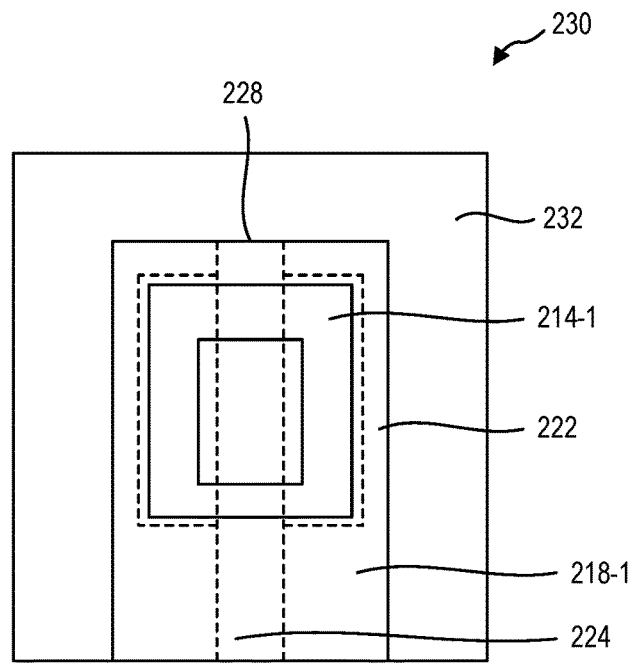
FIG. 4 is a front detail view of the computing device and thermal block of FIG. 3, according to at least some embodiments of the present disclosure.

FIG. 4 is a front detail view of the computing device 230 of FIG. 3. The first thermal block 218-1 is connected to the board 232 and positioned on the first heat-generating component 214-1. The recess 222 is complementarily shaped to the first heat-generating component 214-1, and the channel 224 directly liquid cooling fluid flow over the first heat-generating component 214-1 while the vapor outlet 228 is positioned above the first heat-generating component 214-1 to expel vapor bubbles.

The thermal block may be connected to a support in the immersion tank to hold the thermal block relative to a computing device. In some embodiments, the thermal block is affixed to the computing device to hold the thermal block relative to the computing device. In some embodiments, each type of thermal block has a unique configuration of mounting points for each type of computing device, limiting the risk that a thermal block with an inner surface configured to mate with a first computing device is not affixed incorrectly to a second computing device, which may damage components of the second computing device.

In some embodiments, the computing device is oriented with a board vertically in the immersion tank and/or mounted to the server rack. The thermal block may be affixed to the board with the channel oriented vertically. In some embodiments, the channel or other fluid management feature is oriented horizontally or diagonally to direct cooling fluid over a surface of the computing device. In some embodiments, at least a portion of the channel or other fluid management feature is curved to direct cooling fluid over a surface of the computing device.

In some embodiments, the thermal block is positioned over a single heat-generating component of the computing device. For example, the thermal block can be sized to fit over and/or be affixed to a processor, such as a GPU or a CPU; a storage device, such as solid state memory or platen-based memory; a power supply; a network switch or another communication module; or other heat-generating component. In other embodiments, the thermal block may be sized to fit over and/or be affixed to the entire computing device, such as having an area that is approximately the same or larger than the board of the computing device.

Figure 5:
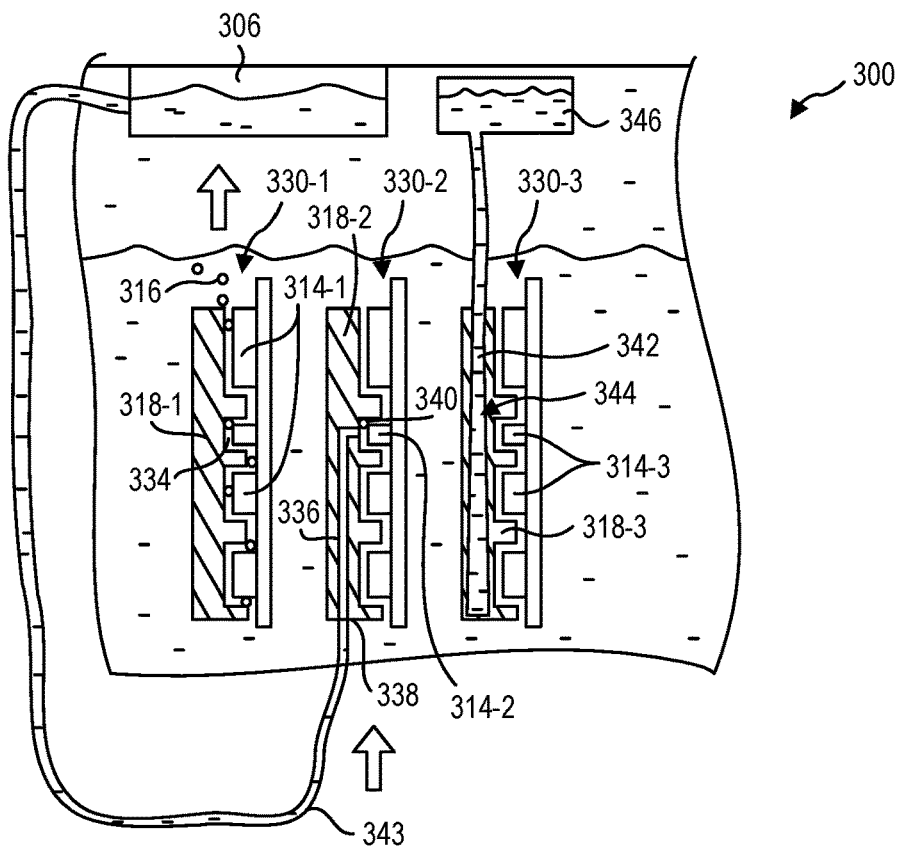
FIG. 5 is a schematic side view of an immersion cooling system with a plurality of thermal blocks, according to at least some embodiments of the present disclosure.

FIG. 5 is a side schematic representation of an embodiment of an immersion cooling system 300 according to the present disclosure. In some embodiments, the immersion cooling system has a plurality of identical computing devices 330-1, 330-2, 330-3 and associated thermal blocks 318-1, 318-2, 318-3. In some embodiments, the computing devices and/or thermal blocks vary within the immersion cooling system 300.

A first thermal block 318-1 is positioned proximate a first computing device 330-1. The first thermal block 318-1 has a first inner surface 320-1 that is complementarily shaped to the topography of the heat-generating components 314-1 of the first computing device 330-1. For example, the surface of the first computing device 330-1 that is oriented toward the first thermal block 318-1 is the block surface of the first computing device 330-1. The block surface is defined by the board and the heat-generating components 314-1 of the first computing device 330-1. The shape of the board and heat-generating components 314-1 of the first computing device 330-1 in profile defines the topography of the first computing device 330-1. The first inner surface 320-1 is shaped to maintain a gap between the heat-generating components 314-1 and the first inner surface 320-1 between 5 mm and 10 mm. In some embodiments, vapor bubbles 316 flow upward through the gap 334 and carry heat toward a condenser 306.

In some embodiments, a thermal block that is configured to fit over a plurality of heat-generating components of the computing device is also configured to complementarily mate with the topography of the components (e.g., the heat-generating components) of the computing device. The inner surface of the thermal block may remain at least 2 mm from the surface of the components. Proximate and/or adjacent to heat-generating components, the inner surface of the thermal block may be between 5 mm and 10 mm from the surface of the heat-generating components to provide clearance for vapor bubbles to pass therebetween.

The thermal block may, in some instances, includes at least one fluid port therein to direct liquid cooling fluid at or near one or more heat-generating components. In some embodiments, the fluid port is an outlet port of a conduit through an interior of the thermal block. The conduit provides fluid communication from an inlet port to the outlet port(s). In some embodiments, the inlet port is connected to a liquid cooling fluid return line from a condenser. The condenser of the immersion cooling system extracts heat from the vapor cooling fluid in the immersion tank.

After condensing the vapor cooling fluid back into liquid cooling fluid, the returned liquid cooling fluid may be lower temperature than the immersion bath and/or the thermal block. Connecting the liquid cooling fluid return line, therefore, can direct the coldest cooling fluid at the heat-generating components that require the most thermal management. In some embodiments, the outlet port may accelerate the flow of the cooling fluid provided by the liquid cooling fluid return line from the condenser, further increasing the convective cooling of the liquid cooling fluid by increasing the flow of cooling fluid over the heat-generating components.

FIG. 5 further illustrates a second thermal block 318-2 proximate a second computing device 330-2. The second thermal block 318-2 includes a conduit 336 with an outlet port 338 and an inlet port 340. The inlet port 340 is connected to a liquid cooling fluid return line 343 from the condenser 306. The cool liquid cooling fluid flows from the liquid cooling fluid return line 343 into the conduit 336. The conduit 336 directs a jet of the cooling fluid directly onto a heat-generating component 314-2 of the second computing device 330-2 to provide enhanced cooling to the heat-generating component 314-2.

In some embodiments, the thermal block is a container than holds a second material therein. The thermal block may be made or include any thermally conductive material including polymers, such as high-density polyethylene, or metals, such as aluminum or copper.

In some embodiments, the second material is a phase-change material with a melting point that is greater than a boiling point of the liquid cooling fluid of the immersion cooling system. In some examples, the second material is a coconut oil, paraffin wax, olefins, or other oils or waxes with a melting temperature near the boiling temperature of the cooling fluid. A second material with a melting temperature higher than the cooling fluid boiling temperature allows the second material to remain a solid phase as long as the cooling fluid efficiency removes heat from the heat-generating components. In the event of a dryout condition, a failure of the condenser, or a surge in heat-generation (such as overclocking or overvoltaging a component of the computing device), the second material can melt, providing a secondary two-phase cooling system.

In some embodiments, the second material has a melting temperature that is less than the boiling temperature of the liquid cooling fluid of the immersion cooling system. A second material with a lower melting temperature can help maintain the thermal block surfaces at a lower temperature and reduce vapor bubble formation adjacent to the thermal block near sensitive components of the computing device.

The second material may be a phase-change fluid. In some embodiments, the second fluid has a boiling temperature that is greater than that of the liquid cooling fluid of the immersion cooling system. A second fluid with a higher boiling temperature allows the second fluid to remain a liquid phase as long as the cooling fluid efficiency removes heat from the heat-generating components. In the event of a dryout condition, a failure of the condenser, or a surge in heat-generation (such as overclocking or overvoltaging a component of the computing device), the second fluid can vaporize, providing a secondary two-phase cooling system. In some embodiments, the second fluid has a boiling temperature that is less than the liquid cooling fluid of the immersion cooling system. A second fluid with a lower boiling temperature can help maintain the thermal block surfaces at a lower temperature and reduce vapor bubble formation adjacent to the thermal block near sensitive components of the computing device.

Referring again to FIG. 5, the third thermal block 318-3 is positioned proximate the third computing device 330-3. The third thermal block 318-3 contains a second material 342 in an interior volume 344 thereof. The interior volume 344 is in fluid communication with an expansion tank 346 to allow the second material 342 to expand upon heating and/or phase changes.

In some embodiments, the density of the thermal block renders the thermal block neutrally buoyant in the cooling fluid. In some embodiments, the thermal block is positively or negatively buoyant in the cooling fluid. In some embodiments, the mass of the thermal block varies with the second fluid contained in the interior volume. The thermal block may vary between being positively buoyant and negatively buoyant.

A thermal block with a second fluid therein may be a closed system with a plurality of tanks in fluid communication with an interior chamber of the thermal block. The interior chamber holds a portion of the second fluid. The pressure and/or mass of the second fluid can be adjusted through a controlled pressure in an accumulator tank. The accumulator tank can feed into the interior volume of the thermal block to control the pressure of the second fluid in the thermal block. In some embodiments, the interior volume is in further fluid communication with an expansion tank that allows expansion of the second fluid out of the interior volume when the second fluid expands or vaporizes.

Figure 6:
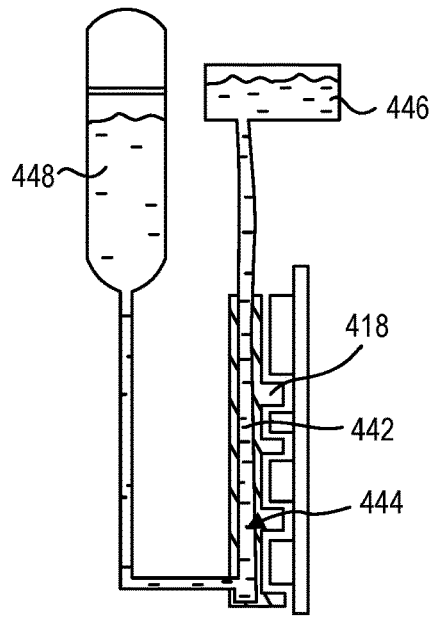
FIG. 6 is a schematic side view of a thermal block in fluid communication with external tanks, according to at least some embodiments of the present disclosure.

FIG. 6 is a side schematic view of an embodiment of a thermal block 418 in fluid communication with an accumulator tank 448 and an expansion tank 446. The second material 442 in the interior volume 444 of the thermal block 418 is held under pressure by the accumulator tank 448. In some embodiments, the accumulator tank 448 allows for an adjustable head pressure that is conveyed to the interior volume of the thermal block 418. The expansion tank 446 may prevent damage to the thermal block 418 and/or the accumulator tank 448 when the second material 442 expands.

In some embodiments, the thermal block includes an emergency failsafe mechanism. In some embodiments, the failsafe mechanism is a single use mechanism that is consumed during use. The thermal block must be replaced to have the failsafe mechanism available again. In some embodiments, the failsafe mechanism is able to be reset or reused multiple times in the same thermal block.

In some embodiments, the thermal block has an interior volume with two materials that are separated by a membrane. The two materials are chemically reactive materials. In some embodiments, the chemically reactive materials endothermically react to absorb heat when mixed with one another. For example, the thermal block may contain a second fluid and a third fluid, where the second fluid is contained in a first chamber and the third fluid is contained in a second chamber. In other examples, the thermal block may contain a fluid and a solid that are chemically reactive with one another. In yet other examples, a third material, such as a catalyst may be present in the interior volume of the thermal block, as well.

The membrane is, in some embodiments, temperature sensitive and will degrade when exposed to a threshold temperature. The threshold temperature is greater than the boiling temperature of the cooling fluid. Therefore, the membrane remains intact during normal operation. In the event the thermal block begins to heat beyond the boiling temperature of the cooling fluid, the membrane may degrade, allowing the chemically reactive materials to react.

Figures 1, 7:
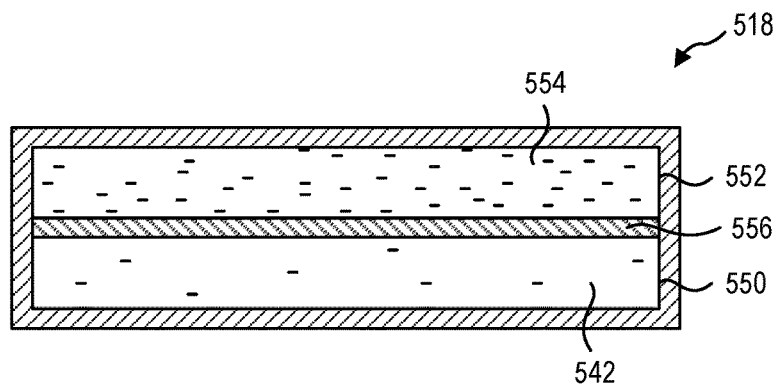
Figures 2, 7:
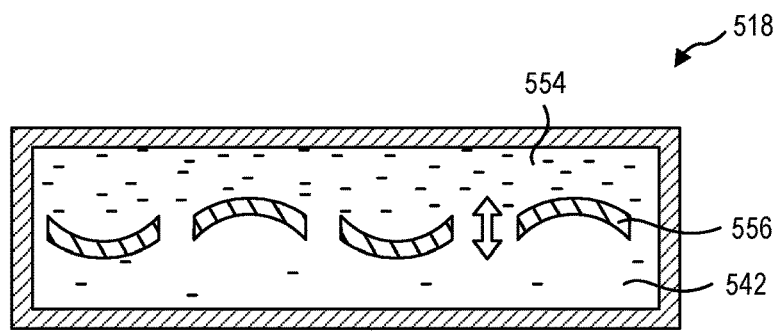

FIGS. 7-1 and 7-2 illustrate an embodiment of a thermal block 518 with a first chamber 550 and a second chamber 552 that contain a second material 542 and a third material 554 that is chemically reactive with the second material 542. In some embodiments, the first chamber 550 and second chamber 552 are the same volume. In some embodiments, the first chamber 550 and second chamber 552 are different volumes, with one being larger than the other. The first chamber 550 and second chamber 552 are separated by a membrane 556, which, as shown in FIG. 7-2 can rupture or otherwise degrade to the point where the second material 542 and the third material 554 can contact one another and react.

The chemically reactive materials may be separated in two chambers or separated in a plurality of chambers, such as in a colloidal distribution. In some embodiments, the third material is contained in a plurality of individual membranes that are suspended in the second fluid. The membranes that enclose the third material are temperature sensitive membranes that may degrade and/or rupture when the second fluid exceeds the threshold temperature. A plurality of individual membranes may allow faster mixing and reaction between the chemically reactive materials to cool the thermal block faster than a single membrane dividing the interior volume into two chambers.

Figure 8:
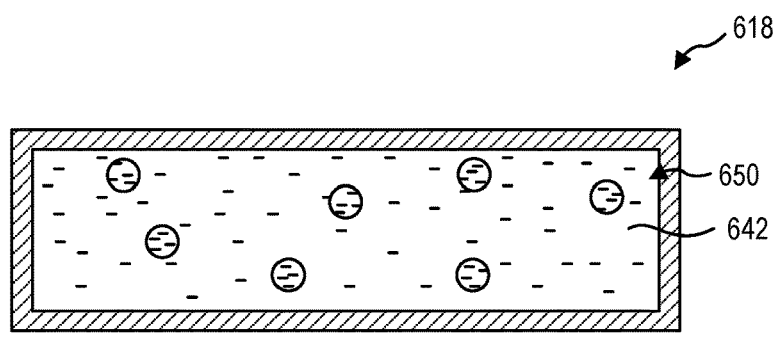
FIG. 8 is a schematic side view of a thermal block with colloidal failsafe mechanism, according to at least some embodiments of the present disclosure.

FIG. 8 is a schematic representation of a thermal block 618 with a first chamber 650 therein. In some embodiments, the first chamber 650 contains a second material 642, as described herein. A plurality of spherical (or otherwise shaped) membranes 656 are positioned in the second fluid 642 and contain a third material 654. In some embodiments, the membranes 656 are made of and/or include a temperature sensitive material that can rupture or otherwise degrade to the point where the second fluid 642 and the third material 654 can contact one another and react.

In some embodiments, the thermal block has one or more features to slow the mixing and/or reaction of the chemically reactive materials. For example, different membranes may include different materials with different threshold temperatures. After a first chamber ruptures and the third material therein reacts with second fluid endothermically, if the temperature continues to rise, another chamber can rupture and allow another mass of the third material to react with the second fluid endothermically. In some embodiments, a first chamber and a second chamber have different thicknesses to delay the mixing of the third material in the second chamber with the second fluid.

Figure 9:
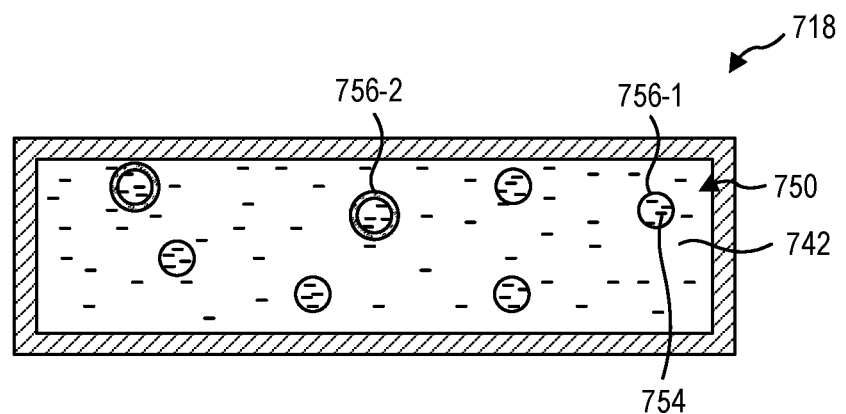
FIG. 9 is a schematic side view of a thermal block with another failsafe mechanism, according to at least some embodiments of the present disclosure.

FIG. 9 is a schematic representation of a thermal block 718 with a first chamber 750 therein. In some embodiments, the first chamber 750 contains a second fluid 742, as described herein. A plurality of spherical (or otherwise shaped) membranes 756-1, 756-2 are positioned in the second fluid 742 and contain a third material 754. In some embodiments, the membranes 756 are made of and/or include a temperature sensitive material that can rupture or otherwise degrade to the point where the second fluid 742 and the third material 754 can contact one another and react. In contrast to the embodiment described in relation to FIG. 8, a first membrane 756-1 and a second membrane 756-2 have different thicknesses. The second membrane 756-2 requires a longer time and/or more heat to degrade and rupture, resulting in a longer release period of the third material 754 into the second fluid 742.

In some embodiments, the third material is a solid material at the threshold temperature of the membrane. When the membrane ruptures, the endothermic reaction between the second fluid and the third material is slower due to the limited surface area of the solid third material.

Figure 10:
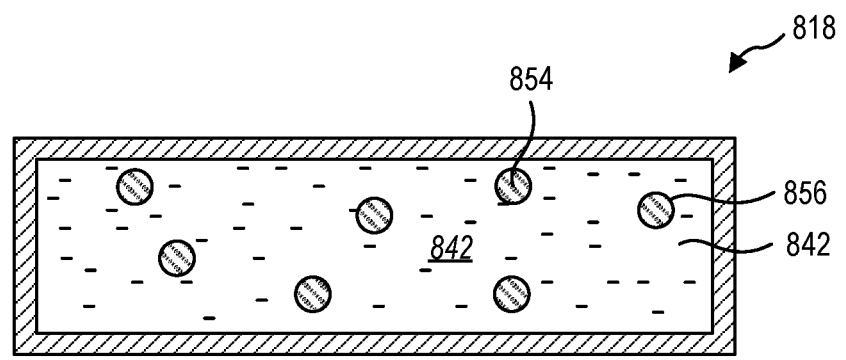
FIG. 10 is a schematic side view of a thermal block with yet another failsafe mechanism, according to at least some embodiments of the present disclosure.

FIG. 10 is a schematic representation of a thermal block 818 with a first chamber 850 therein. In some embodiments, the first chamber 850 contains a second fluid 842, as described herein. A plurality of spherical (or otherwise shaped) membranes 856 are positioned in the second fluid 842 and contain a third material 854. In some embodiments, the membrane 856 is a coating on a solid third material 854. When the coating degrades sufficiently, the solid third material 854 can react with the second fluid 842. Because the endothermic reaction is limited by the surface area of the solid third material 854, the reaction may be slower and/or less energetic than other examples described herein.

INDUSTRIAL APPLICABILITY

The present disclosure relates generally to systems and methods for improving cooling capacity and efficiency of immersion cooling systems. More particularly, the present disclosure relates to increasing the heat capacity of the immersion cooling system and improving the efficiency of fluid movement within the system. In some embodiments, immersion cooling systems cool computing devices or systems that include heat-generating components. The heat-generating components are immersed in a cooling fluid that absorbs the heat from the heat-generating components to cool the heat-generating components. In a two-phase immersion cooling system, the cooling fluid can vaporize. The latent heat of vaporization, combined with the efficient removal of the hot vapor due to the buoyancy in the liquid cooling fluid, allows for very efficient removal of heat from the computing device. The vapor is then passed through a condenser, which cools the vapor cooling fluid to condense and return the cooling fluid to the immersion chamber in a liquid phase.

Temporary operating load increases of the heat-generating components can cause temperature spikes in the surrounding cooling fluid. Further, a power failure can cause the cooling fluid to begin vaporizing quickly, increasing the pressure and temperature in the system and risking damage to the computing devices in the immersion cooling system. Immersion cooling systems include backup power supplies, such as generators, to support the condensers and other cooling systems, but additional thermal ride-through capacity of the immersion cooling system can bridge the time gap before those systems can respond to a power failure. Additionally, increased thermal ride-through capacity can allow temporary overclocking or overvoltaging of a heat-generating component without overwhelming the immersion cooling system's ability to condense the vaporized cooling fluid.

In some immersion cooling systems according to the present disclosure, a thermal block is positioned in the immersion cooling system to replace a portion of the cooling fluid with a thermal mass that has a higher specific heat than the cooling fluid to buffer temperature changes in the cooling fluid. In some embodiments, the thermal block has one or more fluid management features to direct and/or control the flow of cooling fluid over or through the thermal block. The fluid management features may direct liquid cooling fluid toward one or more heat-generating components of a computing device. The fluid management features may direct vapor cooling fluid away from one or more heat-generating components of a computing device.

In some embodiments, the fluid management features include channels formed in a surface of the thermal block. For example, fluid management channels may direct vapor bubbles formed by the a heat-generating component away from the heat-generating component while also encouraging the displacement of the vapor bubbles to draw liquid cooling fluid toward the heat-generating component from a cooler region of thermal block or the computing device. In some embodiments, fluid management channels capture and direct vapor bubbles toward a condenser or vapor conduit to a condenser to more efficiency collect and condense the vaporized cooling fluid.

An immersion cooling system, in some embodiments, has a fluid management feature including a fluid port through at least a portion of the thermal block to direct a flow of cooling fluid at a heat-generating component. For example, a fluid conduit (e.g., a hose) may connect an inlet port of the thermal block to a liquid return port from a condenser of the immersion cooling system. In some embodiments, the fluid management feature of the thermal block connects the inlet port to an outlet port adjacent to and/or proximate to the heat-generating component to direct the recently condensed and cooled liquid cooling fluid at the heat-generating component.

In some embodiments, a thermal block according to the present disclosure includes an emergency cooling failsafe. In some embodiments, the failsafe is a single-use consumable device while in other embodiments, the failsafe is resettable and/or reusable. An emergency cooling failsafe, according to the present disclosure, includes a mechanism for producing an endothermic reaction to absorb heat from the cooling fluid to cool the heat-generating components and limit or prevent dryout before the heat-generating components are damaged. For example, a thermal block may include two chemically reactive materials that, when exposed to one another, produce an endothermic reaction. The two chemically reactive materials may be separated from one another by a temperature-sensitive membrane. In some embodiments, when the membrane exceeds a breakdown temperature, the membrane degrades and allows the two chemically reactive materials to mix and/or react with one another.

An immersion cooling system according to the present disclosure includes a chamber with a cooling fluid positioned therein. A condenser is positioned at the top of the cooling fluid above the liquid cooling fluid and in a vapor of the cooling fluid. The condenser cools part of the vapor of the cooling fluid back into a liquid phase, removing thermal energy from the system and reintroducing the cooling fluid into the immersion bath of the liquid cooling fluid.

In some embodiments, the immersion bath of the liquid cooling fluid has a plurality of heat-generating components positioned in the liquid cooling fluid 108. The liquid cooling fluid surrounds the heat-generating components and may surround other objects or parts attached to the heat-generating components.

As described, conversion of the liquid cooling fluid to a vapor phase requires the input of thermal energy to overcome the latent heat of vaporization and may be an effective mechanism to increase the thermal capacity of the cooling fluid and remove heat from the heat-generating components.

The cooling fluid transitions between a liquid phase and a vapor phase to remove heat from hot or heat-generating components in the chamber. The liquid phase more efficiently receives heat from the components and, upon transition to the vapor phase, the cooling fluid can be cooled and condensed to extract the heat from the cooling fluid before the cooling fluid is returned to the liquid immersion bath at a lower temperature.

In some embodiments, the immersion bath of the liquid cooling fluid has a plurality of heat-generating components positioned in the liquid cooling fluid. The liquid cooling fluid surrounds the heat-generating components and other objects or parts attached to the heat-generating components. In some embodiments, one or more of the heat-generating components includes a heat sink or other device attached to the heat-generating component to conduct away thermal energy and effectively increase the surface area of the heat-generating component.

Because the vapor phase rises in the liquid cooling fluid, the vapor phase can be extracted from the immersion chamber in an upper vapor region of the chamber. A condenser cools part of the vapor of the cooling fluid back into a liquid phase, removing thermal energy from the system and reintroducing the cooling fluid into the immersion bath of the liquid cooling fluid. The condenser radiates or otherwise dumps the thermal energy from the cooling fluid into the ambient environment or into a conduit to carry the thermal energy away from the cooling system.

In some embodiments, the cooling fluid receives heat in a cooling volume of cooling fluid immediately surrounding the heat-generating components. The cooling volume is the region of the cooling fluid (including both liquid and vapor phases) that is immediately surrounding the heat-generating components and is responsible for the convective cooling of the heat-generating components. In some embodiments, the cooling volume is the volume of cooling fluid within 5 millimeters (mm) of the heat-generating components.

The cooling fluid has a boiling temperature below a critical temperature at which the heat-generating components experience thermal damage. For example, the heat-generating components may be computing components that experience damage above 100° Celsius (C). In some embodiments, the boiling temperature of the cooling fluid is less than a critical temperature of the heat-generating components. In some embodiments, the boiling temperature of the cooling fluid is less than about 90° C., less than about 80° C., less than about 70° C., or less than about 60° C. In some embodiments, the boiling temperature of the cooling fluid is at least about 35° C. In some embodiments, the cooling fluid includes water, glycol, or a combination of water and glycol. In some embodiments, the cooling fluid is an aqueous solution. In some embodiments, the cooling fluid is an electronic liquid, such as FC-72 available from 3M, or similar non-conductive fluids. The heat-generating components, immersion tank surfaces, or other elements of the immersion cooling system positioned in the cooling fluid may have nucleation sites on a surface thereof that promote the nucleation of vapor bubbles of the cooling fluid at or below the boiling temperature of the cooling fluid.

Large immersion cooling systems require a portion of the immersion bath volume to be cooling fluid that is outside of the cooling volume and, therefore, inefficiently cooling the heat-generating components. In some embodiments, not all components of the computing device generate enough heat to need immersion cooling to remain in a safe operating temperature range. In some embodiments, a graphical processing unit (GPU) generates more heat than a platen-based storage device, and ambient air cooling is sufficient to cool the storage device but not the GPU.

A thermal block according to the present disclosure, in some embodiments, has an inner surface that is oriented toward the computing device or other heat-generating component that is shaped to approximate the shape of the computing device. In some embodiments, the inner surface is shaped to complementarily mate with the topography of the computing device. For example, the inner surface of the thermal block may be formed to follow the surface of the heat-generating components of the computing device such that the inner surface is between 5 millimeters (mm) and 10 mm of at least two of the heat-generating components. In some embodiments, the inner surface of the thermal block may be formed to be positioned with 5 to 10 mm of the entire of surface of the computing device. The close placement of the thermal block to the heat-generating component allows efficient transfer of heat to the thermal block, however, some space therebetween is maintained to allow fluid flow and the evacuation of vapor bubbles.

In some embodiments, the thermal block has at least one channel positioned on the inner surface that is recessed away from the computing device. The thermal block may have a single channel that facilitates a higher rate of fluid transfer through the portion of the thermal block including the channel. The thermal block may include a plurality of channels to disperse vapor cooling fluid over a larger area of the computing device and/or remove vapor cooling fluid from the computing device to limit and/or prevent dryout. In some embodiments, the channel has a depth relative to the surface of the computing device that varies along a length of the channel. For example, the channel may have an increasing depth along the length of the channel to allow the removal of vapor, which occupies a larger volume than the liquid cooling fluid and which forms a greater percentage of the cooling fluid as the vapor bubbles float up along the length of the channel.

The thermal block has, in some embodiments, a vapor outlet formed in an end of the block that collects and directs vapor bubbles toward a vapor collection device. As the vapor bubbles flow upward through the channel and out of the vapor outlet, the vapor bubbles can create a risk of dryout for components positioned above the thermal block (e.g., in the direction of buoyancy in the cooling fluid). In some embodiments, the thermal block has a vapor outlet formed in an end of the block that directs vapor bubbles away from a second thermal block or second computing device in a flow direction of the bubbles.

The thermal block may be connected to a support in the immersion tank to hold the thermal block relative to a computing device. In some embodiments, the thermal block is affixed to the computing device to hold the thermal block relative to the computing device. In some embodiments, each type of thermal block has a unique configuration of mounting points for each type of computing device, limiting the risk that a thermal block with an inner surface configured to mate with a first computing device is not affixed incorrectly to a second computing device, which may damage components of the second computing device.

In some embodiments, the computing device is oriented with a board vertically in the immersion tank and/or mounted to the server rack. The thermal block may be affixed to the board with the channel oriented vertically. In some embodiments, the channel or other fluid management feature is oriented horizontally or diagonally to direct cooling fluid over a surface of the computing device. In some embodiments, at least a portion of the channel or other fluid management feature is curved to direct cooling fluid over a surface of the computing device.

In some embodiments, a thermal block includes a fiduciary mark on an outer surface of the thermal blocks that is identifiable by a machine vision system to locate and/or orient the thermal blocks and/or the computing device in a server rack or immersion cooling system.

In some embodiments, the thermal block is positioned over a single heat-generating component of the computing device. For example, the thermal block can be sized to fit over and/or be affixed to a processor, such as a GPU or a CPU; a storage device, such as solid state memory or platen-based memory; a power supply; a network switch or another communication module; or other heat-generating component. In other embodiments, the thermal block may be sized to fit over and/or be affixed to the entire computing device, such as having an area that is approximately the same or larger than the board of the computing device.

In some embodiments, a thermal block that is configured to fit over a plurality of heat-generating components of the computing device is also configured to complementarily mate with the topography of the components (e.g., the heat-generating components) of the computing device. The inner surface of the thermal block may remain at least 2 mm from the surface of the components. Proximate and/or adjacent to heat-generating components, the inner surface of the thermal block may be between 5 mm and 10 mm from the surface of the heat-generating components to provide clearance for vapor bubbles to pass therebetween.

The thermal block may, in some instances, includes at least one fluid port therein to direct liquid cooling fluid at or near one or more heat-generating components. In some embodiments, the fluid port is an outlet port of a conduit through an interior of the thermal block. The conduit provides fluid communication from an inlet port to the outlet port(s). In some embodiments, the inlet port is connected to a liquid cooling fluid return line from a condenser. The condenser of the immersion cooling system extracts heat from the vapor cooling fluid in the immersion tank.

After condensing the vapor cooling fluid back into liquid cooling fluid, the returned liquid cooling fluid may be lower temperature than the immersion bath and/or the thermal block. Connecting the liquid cooling fluid return line, therefore, can direct the coldest cooling fluid at the heat-generating components that require the most thermal management. In some embodiments, the outlet port may accelerate the flow of the cooling fluid provided by the liquid cooling fluid return line from the condenser, further increasing the convective cooling of the liquid cooling fluid by increasing the flow of cooling fluid over the heat-generating components.

In some embodiments, the thermal block is a container than holds a second material therein. The outer layer of the thermal block may be made or include any thermally conductive material including polymers, such as high density polyethylene, or metals, such as aluminum or copper.

In some embodiments, the second material is a phase-change material with a melting point that is greater than a boiling point of the liquid cooling fluid of the immersion cooling system. In some examples, the second material is a coconut oil, paraffin wax, olefins, or other oils or waxes with a melting temperature near the boiling temperature of the cooling fluid. A second material with a melting temperature higher than the cooling fluid boiling temperature allows the second material to remain a solid phase as long as the cooling fluid efficiency removes heat from the heat-generating components. In the event of a dryout condition, a failure of the condenser, or a surge in heat-generation (such as overclocking or overvoltaging a component of the computing device), the second material can melt, providing a secondary two-phase cooling system.

In some embodiments, the second material has a melting temperature that is less than the boiling temperature of the liquid cooling fluid of the immersion cooling system. A second material with a lower melting temperature can help maintain the thermal block surfaces at a lower temperature and reduce vapor bubble formation adjacent to the thermal block near sensitive components of the computing device.

In some embodiments, the density of the thermal block renders the thermal block neutrally buoyant in the cooling fluid. In some embodiments, the thermal block is positively or negatively buoyant in the cooling fluid. In some embodiments, the mass of the thermal block varies with the second fluid contained in the interior volume. The thermal block may vary between being positively buoyant and negatively buoyant.

The second material may be a phase-change fluid. In some embodiments, the second fluid has a boiling temperature that is greater than that of the liquid cooling fluid of the immersion cooling system. A second fluid with a higher boiling temperature allows the second fluid to remain a liquid phase as long as the cooling fluid efficiency removes heat from the heat-generating components. In the event of a dryout condition, a failure of the condenser, or a surge in heat-generation (such as overclocking or overvoltaging a component of the computing device), the second fluid can vaporize, providing a secondary two-phase cooling system. In some embodiments, the second fluid has a boiling temperature that is less than the liquid cooling fluid of the immersion cooling system. A second fluid with a lower boiling temperature can help maintain the thermal block surfaces at a lower temperature and reduce vapor bubble formation adjacent to the thermal block near sensitive components of the computing device.

A thermal block with a second fluid therein may be a closed system with a plurality of tanks in fluid communication with an interior chamber of the thermal block. The interior chamber holds a portion of the second fluid. The pressure and/or mass of the second fluid can be adjusted through a controlled pressure in an accumulator tank. The accumulator tank can feed into the interior volume of the thermal block to control the pressure of the second fluid in the thermal block. In some embodiments, the interior volume is in further fluid communication with an expansion tank that allows expansion of the second fluid out of the interior volume when the second fluid expands or vaporizes.

In some embodiments, the thermal block includes an emergency failsafe mechanism. In some embodiments, the failsafe mechanism is a single use mechanism that is consumed during use. The thermal block must be replaced to have the failsafe mechanism available again. In some embodiments, the failsafe mechanism is able to be reset or reused multiple times in the same thermal block.

In some embodiments, the thermal block has an interior volume with two materials that are separated by a membrane. The two materials are chemically reactive materials. In some embodiments, the chemically reactive materials endothermically react to absorb heat when mixed with one another. For example, the thermal block may contain a second fluid and a third fluid, where the second fluid is contained in a first chamber and the third fluid is contained in a second chamber. In other examples, the thermal block may contain a fluid and a solid that are chemically reactive with one another. In yet other examples, a third material, such as a catalyst may be present in the interior volume of the thermal block, as well.

The membrane is, in some embodiments, temperature sensitive and will degrade when exposed to a threshold temperature. The threshold temperature is greater than the boiling temperature of the cooling fluid. Therefore, the membrane remains intact during normal operation. In the event the thermal block begins to heat beyond the boiling temperature of the cooling fluid, the membrane may degrade, allowing the chemically reactive materials to react.

The chemically reactive materials may be separated in two chambers or separated in a plurality of chambers, such as in a colloidal distribution. In some embodiments, the third material is contained in a plurality of individual membranes that are suspended in the second fluid. The membranes that enclose the third material are temperature sensitive membranes that may degrade and/or rupture when the second fluid exceeds the threshold temperature. A plurality of individual membranes may allow faster mixing and reaction between the chemically reactive materials to cool the thermal block faster than a single membrane dividing the interior volume into two chambers.

In some embodiments, the thermal block has one or more features to slow the mixing and/or reaction of the chemically reactive materials. For example, different membranes may include different materials with different threshold temperatures. After a first chamber ruptures and the third material therein reacts with second fluid endothermically, if the temperature continues to rise, another chamber can rupture and allow another mass of the third material to react with the second fluid endothermically. In some embodiments, a first chamber and a second chamber have different thicknesses to delay the mixing of the third material in the second chamber with the second fluid. In some embodiments, the third material is a solid material at the threshold temperature of the membrane. When the membrane ruptures, the endothermic reaction between the second fluid and the third material is slower due to the limited surface area of the solid third material.

The present disclosure relates to systems and methods for systems and methods for improving cooling capacity and efficiency of immersion cooling systems according to at least the examples provided in the sections below:

1. A thermal management system for a computing device comprising:
   an immersion tank with a cooling fluid filling at least a portion of the immersion tank;
   a computing device positioned in the cooling fluid, wherein the computing device heats the cooling fluid; and
   a thermal block positioned in the cooling fluid and configured to receive heat from the cooling fluid, wherein the thermal block includes:
      a fluid management feature to direct flow of the cooling fluid relative to the thermal block and computing device.
2. The thermal management system of section 1, wherein the thermal block has at least one fluid outlet.
3. The thermal management system of section 1, wherein the thermal block is a container with a second material contained in an interior volume of the thermal block.
4. The thermal management system of section 3, wherein the thermal block further includes a third material, and the second material is chemically reactive with the third material.
5. The thermal management system of any preceding section, wherein the thermal block has an inner surface that complementarily mates with at least a portion of a topography of the computing device.
6. The thermal management system of any preceding section, wherein the thermal block includes a plurality of fluid channels in an inner surface thereof.
7. The thermal management system of section 6, wherein the fluid channels direct vapor bubbles of the cooling fluid toward a vapor collection point of the immersion tank.
8. The thermal management system of section 6, wherein the fluid channels direct liquid cooling fluid toward a heat-generating component of the computing device.
9. The thermal management system of section 8, wherein the fluid channels direct liquid cooling fluid from a liquid cooling fluid return line toward the heat-generating component of the computing device.
10. The thermal management system of any preceding section, wherein an inner surface of the thermal block is complementarily shaped to a topography of the computing device.
11. The thermal management system of any preceding section, wherein an inner surface of the thermal block is positioned with a gap of between 2 millimeters (mm) and 10 mm between the inner surface and a block surface of the computing device.
12. The thermal management system of any preceding section, wherein the thermal block has fiduciary marks on a top surface thereof, the fiduciary marks being visible to a machine vision system.
13. A thermal management system for a computing device comprising:
   an immersion tank with a cooling fluid filling at least a portion of the immersion tank;
   a computing device positioned in the cooling fluid, wherein the computing device heats the cooling fluid; and
   a thermal block positioned in the cooling fluid and configured to receive heat from the cooling fluid, wherein the thermal block is a container with a second material therein.
14. The thermal management system of section 13, wherein the second material is a phase change material.
15. The thermal management system of section 13 or 14, wherein the thermal block includes high density polyethylene.
16. The thermal management system of any of sections 13-15, wherein the thermal block is neutrally buoyant in the cooling fluid.
17. The thermal management system of any of sections 13-16, wherein the second material is a fluid at room temperature.
18. A thermal management system for a computing device comprising:
   an immersion tank with a cooling fluid filling at least a portion of the immersion tank;
   a computing device positioned in the cooling fluid, wherein the computing device heats the cooling fluid; and
   a thermal block positioned in the cooling fluid and configured to receive heat from the cooling fluid, wherein the thermal block contains a second material and a third material that are endothermically reactive with one another.
19. The thermal management system of section 18, wherein the second material and third material are separated in the thermal block by a temperature sensitive membrane.

20. The thermal management system of section 19, wherein the third material is contained in a plurality of membranes and separated from the second material.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the scope of the present disclosure, and that various changes, substitutions, and alterations may be made to embodiments disclosed herein without departing from the scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management system for a computing device comprising:
    an immersion tank with a cooling fluid filling at least a portion of the immersion tank;
    the computing device positioned in the cooling fluid, wherein the computing device heats the cooling fluid; and
    a thermal block submerged in a liquid phase of the cooling fluid and configured to receive the heat from the cooling fluid, wherein the thermal block is a container formed of a first material and with a second material contained in an interior volume of the thermal block, wherein the second material is a liquid or a solid at room temperature, wherein the thermal block further includes a third material, and the second material is chemically reactive with the third material, wherein the third material is a liquid or a solid at the room temperature.

2. The thermal management system of claim 1, wherein the thermal block has a surface that complementarily mates with at least a portion of a topography of the computing device.

3. The thermal management system of claim 1, wherein the thermal block includes a plurality of fluid channels in a surface of the thermal block.

4. The thermal management system of claim 3, wherein the fluid channels direct vapor bubbles of the cooling fluid away from the computing device and toward a vapor collection point of the immersion tank.

5. The thermal management system of claim 3, wherein the fluid channels direct the liquid phase of the cooling fluid toward a heat-generating component of the computing device.

6. The thermal management system of claim 5, wherein the fluid channels direct the liquid phase of the cooling fluid from a liquid cooling fluid return line toward the heat-generating component of the computing device.

7. The thermal management system of claim 1, wherein a surface of the thermal block is complementarily shaped to a topography of the computing device.

8. The thermal management system of claim 1, wherein a surface of the thermal block is positioned with a gap of between 2 millimeters (mm) and 10 mm between from a surface of the computing device.

9. The thermal management system of claim 1, wherein the thermal block has fiduciary marks on a top surface thereof, the fiduciary marks being visible to a machine vision system.

10. The thermal management system of claim 1, wherein the third material degrades above a breakdown temperature of the third material.

11. The thermal management system of claim 1, wherein the first material is a high density polyethylene.

12. The thermal management system of claim 1, wherein the thermal block is neutrally buoyant in the cooling fluid.

13. The thermal management system of claim 1, wherein the third material is a solid at the room temperature.

14. A method for thermally managing a system for a computing device comprising:
    providing the immersion tank of claim 1;
    positioning the computing device of claim 1 in the cooling fluid of claim 1; and
    submerging the thermal block of claim 1 in the liquid phase of the cooling fluid of claim 1.

15. A thermal management system for a computing device comprising:
    an immersion tank with a cooling fluid filling at least a portion of the immersion tank;
    the computing device positioned in the cooling fluid, the cooling fluid is in a liquid phase at room temperature, wherein the computing device heats the cooling fluid; and
    a thermal block formed of a first material and submerged in the liquid phase of the cooling fluid and configured to receive the heat from the cooling fluid, wherein the thermal block contains a second material and a third material that are endothermically chemically reactive with one another, wherein one or more of the second material or the third material are a solid or liquid at the room temperature, such that exposure of the second material to the cooling fluid reduces the temperature of the cooling fluid below a boiling point of the cooling fluid.

16. The thermal management system of claim 15, wherein the second material and the third material are separated in the thermal block by a temperature sensitive membrane.

17. The thermal management system of claim 15, wherein the third material is contained in a plurality of membranes each formed by a temperature sensitive membrane and separated from the second material.

* * * * *